United States Patent
Koike et al.

(10) Patent No.: US 8,298,859 B2
(45) Date of Patent: Oct. 30, 2012

(54) SEMICONDUCTOR CONNECTION COMPONENT

(75) Inventors: Nobuya Koike, Tokyo (JP); Tsukasa Matsushita, Tokyo (JP); Hiroshi Sato, Tokyo (JP); Keiichi Okawa, Tokyo (JP); Atsushi Nishikizawa, Tokyo (JP)

(73) Assignee: Renesas Electronics Corporation, Kanagawa ( * ) Notice: Subject to any disclaimer, the term of this patent is extended or adjusted under 35 U.S.C. 154(b) by 0 days.

(21) Appl. No.: 13/035,273

(22) Filed: Feb. 25, 2011

(65) Prior Publication Data
US 2011/0143500 A1    Jun. 16, 2011

Related U.S. Application Data

(60) Continuation of application No. 12/267,079, filed on Nov. 7, 2008, now Pat. No. 7,968,370, which is a division of application No. 11/503,153, filed on Aug. 14, 2006, now Pat. No. 7,462,887.

(30) Foreign Application Priority Data

Aug. 16, 2005 (JP) ................................. 2005-235778

(51) Int. Cl.
  *H01L 21/44* (2006.01)
  *H01L 21/48* (2006.01)
  *H01L 21/50* (2006.01)

(52) U.S. Cl. . 438/106; 438/123; 438/197; 257/E21.006; 257/E21.051; 257/E21.077; 257/E21.499; 257/E21.503; 257/E21.511

(58) Field of Classification Search ................ 438/106, 438/111, 123, 197, 612, 717; 257/E21.006, 257/E21.051, E21.077, E21.499, E21.503, 257/E21.511

See application file for complete search history.

(56) References Cited

U.S. PATENT DOCUMENTS

| | | | |
|---|---|---|---|
| 6,307,272 B1 | 10/2001 | Takahashi et al. | |
| 7,462,887 B2 * | 12/2008 | Koike et al. | 257/177 |
| 7,968,370 B2 * | 6/2011 | Koike et al. | 438/106 |
| 2004/0080028 A1 | 4/2004 | Yanagisawa et al. | |
| 2007/0035019 A1 | 2/2007 | Carney et al. | |
| 2007/0040187 A1 | 2/2007 | Koike et al. | |
| 2007/0040260 A1 | 2/2007 | Otremba | |
| 2007/0075409 A1 | 4/2007 | Letterman et al. | |
| 2007/0111393 A1 | 5/2007 | Burghout et al. | |
| 2007/0114676 A1 | 5/2007 | Anderson et al. | |

FOREIGN PATENT DOCUMENTS

| | | |
|---|---|---|
| JP | 11-204724 | 7/1999 |
| JP | 2000-49184 | 2/2000 |
| JP | 2004-153234 | 5/2004 |

* cited by examiner

*Primary Examiner* — David Nhu
(74) *Attorney, Agent, or Firm* — Mattingly & Malur, PC

(57) ABSTRACT

There is a need for providing a technology capable of decreasing on-resistance of a power transistor in a semiconductor device that integrates the power transistor and a control integrated circuit into a single semiconductor chip. There is another need for providing a technology capable of reducing a chip size of a semiconductor device. A semiconductor chip includes a power transistor formation region to form a power transistor, a logic circuit formation region to form a logic circuit, and an analog circuit formation region to form an analog circuit. A pad is formed in the power transistor formation region. The pad and a lead are connected through a clip whose cross section is larger than that of a wire. On the other hand, a bonding pad is connected through the wire.

4 Claims, 15 Drawing Sheets

SEMICONDUCTOR CONNECTION COMPONENT

This is a continuation application of U.S. application Ser. No. 12/267,079, filed Nov. 7, 2008, now U.S. Pat. No. 7,968,370, which is a divisional application of U.S. Ser. No. 11/503,153 filed Aug. 14, 2006, now U.S. Pat. No. 7,462,887, the contents of which is hereby incorporated by reference into this application.

CROSS-REFERENCE TO RELATED APPLICATION

The present application claims priority from Japanese patent application No. 2005-235778 filed on Aug. 16, 2005, the content of which is hereby incorporated by reference into this application.

BACKGROUND OF THE INVENTION

The present invention relates to a semiconductor device and its manufacturing technology. More specifically, the invention concerns a semiconductor device forming a power transistor and a control integrated circuit on a single semiconductor chip and a technology effectively applied to the manufacturing technology of the semiconductor device.

A so-called discrete power transistor is composed of an independent power transistor and uses a thick film wiring because there is no need for forming complicated wiring. The use of the thick film wiring increases the wiring's cross section, making it possible to decrease the on-resistance. Further, the use of the thick film wiring can decrease a bonding damage that may be caused when a gold wire is bonded to a bonding pad. This makes it possible to arrange the power transistor under the bonding pad.

For example, Japanese Unexamined Patent Publication No. 2000-49184 (patent document 1) discloses the technology for discrete power transistors. This technology thickens a bonding wire connected to a source electrode of the power transistor and thins a bonding wire connected to a gate electrode.

The technology disclosed in Japanese Unexamined Patent Publication No. 2004-153234 (patent document 2) uses a thick metal strap for connection between the power transistor's source electrode and an external terminal and uses a thin metal strap for connection between the gate electrode and the external terminal.

There is available a standalone packaged semiconductor device that seals a semiconductor chip with a power transistor formed thereon and a semiconductor chip with a logic circuit formed thereon. Such semiconductor device concerns the technology described in Japanese Unexamined Patent Publication No. Hei 11 (1999)-204724 (patent document 3). The technology uses a thick bonding wire to connect a semiconductor chip for forming a power transistor and uses a thin bonding wire to connect a semiconductor chip for forming a logic circuit.

Further, there is a technology that forms a power transistor and a control integrated circuit on a single semiconductor chip. Such technology uses a bonding wire to connect the semiconductor chip with an external terminal (lead). The technology forms no device under the bonding pad so as to prevent damage during bonding.

[Patent document 1] Japanese Unexamined Patent Publication No. 2000-049184
[Patent document 2] Japanese Unexamined Patent Publication No. 2004-153234
[Patent document 3] Japanese Unexamined Patent Publication No. Hei 11 (1999)-204724

SUMMARY OF THE INVENTION

In recent years, there is a need for decreasing an area for mounting semiconductor devices or a user need for simplified assembly. For this purpose, a solution is to form a power transistor and a control integrated circuit (such as a logic circuit and an analog circuit) on a single semiconductor chip.

When the power transistor and the control integrated circuit are formed into one semiconductor chip, a fine wiring is used for large integration of a control integrated circuit. To form this fine wiring, a semiconductor manufacturing process uses the thin film wiring technology using an aluminum film.

Since the power transistor and the control integrated circuit are mounted on one semiconductor chip, however, the use of fine wiring for the control integrated circuit signifies the use of fine wiring for the power transistor. It is desirable for the power transistor to use a thick film wiring because a wiring cross section can be increased and the on-resistance can be decreased. For large integration of the control integrated circuit, however, the use of the thin film wiring decreases the wiring cross section and increases the on-resistance. That is, integrating the power transistor and the control integrated circuit into a single chip increases the power transistor's on-resistance and the power consumption.

Since a discrete power transistor can use the thick film wiring, a bonding damage from the bonding pad can be relieved by thick film wiring. Accordingly, no problem occurs even when the power transistor is arranged under the bonding pad. When the power transistor and the control integrated circuit are integrated into a single chip, however, the power transistor requires thin film wiring instead of thick film wiring. The thin film wiring decreases resistance against a bonding damage to the bonding pad. As a result, the power transistor cannot be arranged under the bonding pad, increasing the semiconductor chip area, leading to occurrence of a problem.

It is an object of the present invention to provide a technology capable of decreasing on-resistance of a power transistor in a semiconductor device that integrates the power transistor and a control integrated circuit into a single semiconductor chip.

It is another object of the present invention to provide a technology capable of reducing a chip size of a semiconductor device that integrates a power transistor and a control integrated circuit into a single semiconductor chip.

These and other objects and novel features of the invention may be readily ascertained by referring to the following description and appended drawings.

The following summarizes representative embodiments of the invention disclosed in this application.

A semiconductor device according to the invention includes: (a) a semiconductor chip; (b) a first region and a second region formed over the semiconductor chip; (c) a plurality of first bonding pads formed in the first region; and (d) a plurality of second bonding pads formed in the second region.

The semiconductor device further includes: (e) a plurality of first leads and a plurality of second leads; (f) a first conductor that electrically connects the first bonding pad with the first lead; and (g) a second conductor that electrically connects the second bonding pad with the second lead. A cross section of the first conductor is larger than a cross section of the second conductor.

A semiconductor device manufacturing method according to the invention includes the steps of: (a) mounting a semiconductor chip having a first region and a second region over a lead frame having a plurality of first leads and a plurality of second leads; and (b) forming a connection material over a first bonding pad and the first lead formed in the first region. The method further includes the steps of: (c) electrically connecting the first bonding pad with the first lead via a clip; and (d) applying heat treatment to the semiconductor chip. Moreover, the method includes the step of (e) after the step (d), electrically connecting a second bonding pad and the second lead formed in the second region via a wire.

The following summarizes effects provided by the representative aspects of the invention disclosed in this application.

In a semiconductor device that integrates a power transistor and a control integrated circuit into a single semiconductor chip, a clip instead of a wire is used to electrically connect a bonding pad in a power transistor formation region with an external terminal (lead). The clip has a larger cross section than that of the wire. The use of the clip can decrease the power transistor's on-resistance and therefore its power consumption. Since the clip instead of the wire is used to connect the bonding pad with the lead in the power transistor formation region, it is possible to decrease the wiring resistance for the chip and suppress a bonding damage. Consequently, devices such as power transistors can be arranged below the bonding pad, making it possible to miniaturize the semiconductor chip.

DETAILED DESCRIPTION OF THE PREFERRED EMBODIMENTS

Figure 1:
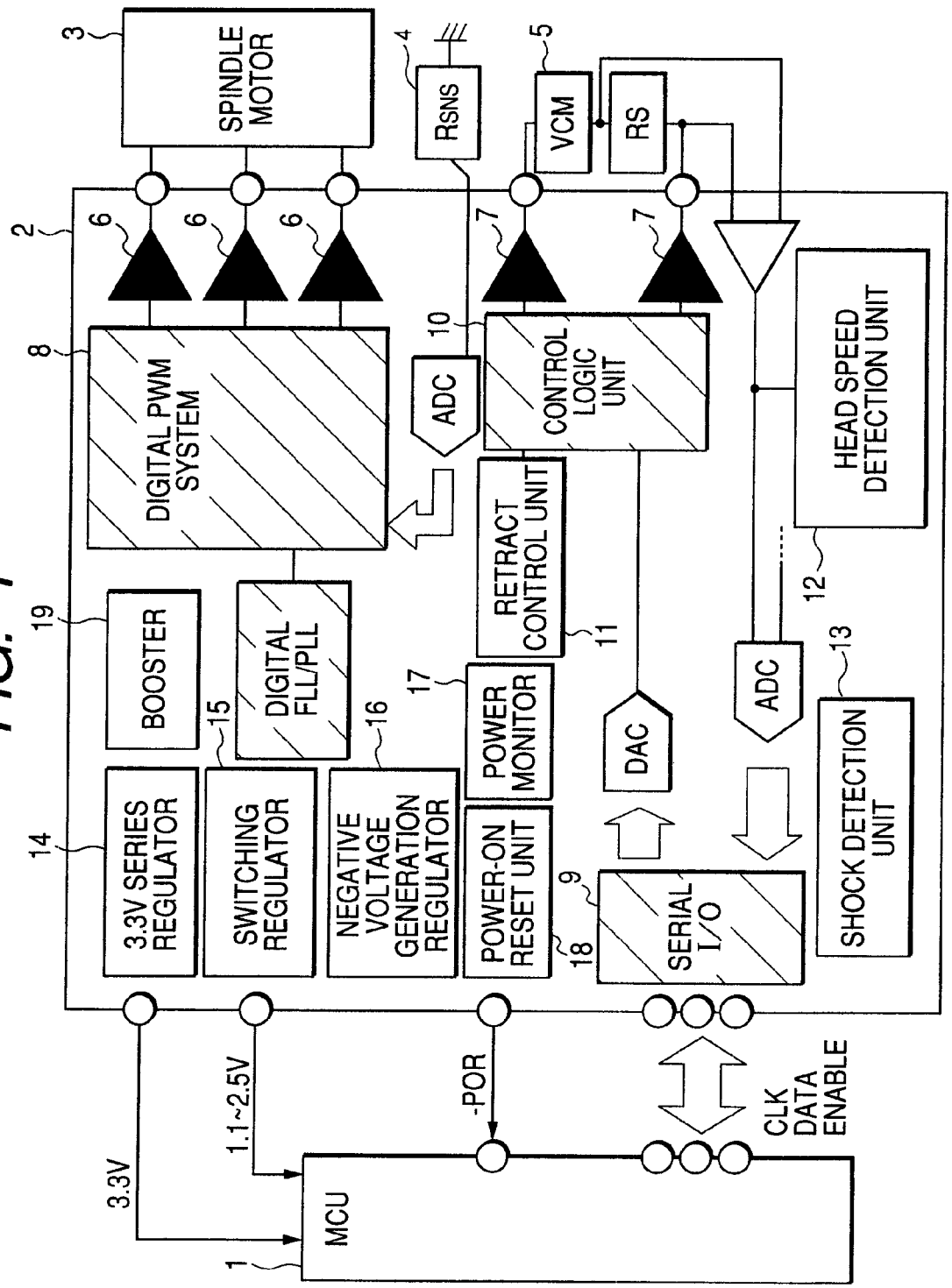
FIG. 1 shows a circuit block of a hard disk apparatus.

The following describes the embodiments divided into multiple sections or further embodiments as needed. Unless specifically specified, they are related with each other and one is a modification, detail, supplement, and the like of part or all of the other.

The following embodiments may refer to the number of elements and the like (including the number of items, numeric values, quantities, and ranges). The embodiments are not limited to specific values and may be greater than or equal to or smaller than or equal to the specific values except when specific values are explicitly specified and when the embodiments are obviously limited to specific values in principle, for example.

Further, in the following embodiments, it is obvious that the constituent elements (including element steps and the like) are not necessarily required except when they are explicitly specified and when they are apparently required in principle, for example.

Similarly, the following embodiments may refer to shapes, positional relations, and the like of the constituent elements and the like. In such case, the description is assumed to actually contain those approximate to or similar to the shapes and the like except when the shapes, positional relations, and the like are explicitly specified and when they should be apparently avoided in principle, for example. This also applies to the above-mentioned numeric values and ranges.

The embodiments of the invention will be described in further detail with reference to the accompanying drawings. Throughout all the drawings for describing the embodiments, the same members are depicted by the same reference numerals and a repetitive description is omitted for simplicity.

The embodiment applies the semiconductor device according to the embodiment to a hard disk apparatus. FIG. 1 shows a circuit block of the hard disk apparatus. In FIG. 1, the hard disk apparatus includes an MCU (Micro Controller Unit) 1, an HDD motor driver IC 2, a spindle motor 3, an Rsns 4, and a VCM (Voice Coil Motor) 5.

The MCU 1 is a microcomputer that controls the entire hard disk apparatus. The MCU 1 is constructed to perform a digital signal process. The HDD motor driver IC 2 is constructed to be capable of controlling rotations of the spindle motor 3, controlling positioning of a head arm connected to a VCM 5, monitoring power supply voltage, and generating a specified voltage. The HDD motor driver IC 2 is composed of one semiconductor chip where a power transistor, a logic circuit (digital circuit), and an analog circuit are formed. In this specification, the logic circuit and the analog circuit are collectively referred to as a control integrated circuit. That is, the control integrated circuit signifies the logic circuit and the analog circuit formed in the HDD motor driver IC 2. The semiconductor device according to the embodiment is applied to this HDD motor driver IC 2.

The spindle motor 3 is a motor to rotate a disk constituting the hard disk. The Rsns 4 detects a current flowing through the spindle motor 3. The VCM 5 is connected to a head arm for reading or writing to the hard disk and positions this head arm.

The hard disk apparatus is constructed as mentioned above. The following describes the construction of the HDD motor driver IC 2 in more detail. The HDD motor driver IC 2 includes a power transistor unit, a logic circuit unit, and an analog circuit unit. The power transistor unit contains the power transistor 6 and the power transistor 7 both formed therein. The power transistor 6 is connected to the spindle motor 3 and functions as a driver circuit to supply current to the spindle motor 3. On the other hand, the power transistor 7 is connected to the VCM 5 and functions as a driver circuit to supply current to the VCM 5.

The logic circuit (digital circuit) unit includes a digital PWM system 8, a serial I/O 9, and a control logic unit 10. The digital PWM system 8 controls the spindle motor 3 to prevent a sudden current change so that the spindle motor 3 can operate smoothly. The digital PWM system 8 can remove irregular rotation of the spindle motor 3 and suppress noise of the spindle motor 3 when it rotates. The digital PWM system 8 controls the spindle motor 3 based on a result from the Rsns 4 that detects a current supplied to the spindle motor 3. That is, a detection result of the Rsns 4 is fed back to the digital PWM system 8 that then controls the spindle motor 3.

The serial I/O 9 is used to input or output digital signals between the MCU 1 and the HDD motor driver IC 2. For example, a digital signal output from the MCU 1 is input to the serial I/O 9. The digital signal is output from the serial I/O 9 and is converted into an analog signal via a D/A converter. The converted analog signal is transmitted to the power transistor 7 through a switching operation of the control logic unit 10 to supply current to the VCM 5. In this manner, the VCM 5 operates to move the head arm to a specified position of the hard disk. While the digital signal is output from the serial I/O 9 and is converted into the analog signal, the control logic unit 10 is constructed to perform the switching operation that transmits the analog signal to the power transistor 7. In the event of an anomaly such as a sudden failure of the power supply, the control logic unit 10 closes the connection with the serial I/O 9 so as not to transmit signals to the power transistor 7 from the serial I/O 9. The control logic unit 10 performs the switching operation to transmit a signal from a retract control unit 11 as an analog circuit to the power transistor 7. In this manner, the VCM 5 connected to the power transistor 7 operates to retract the head arm to a safe position. The control logic unit 10 is composed of a digital circuit and functions as a switch that connects the power transistor 7 with a signal from the serial I/O 9 or from the retract control unit 11. That is, the control logic unit 10 has a function to control current supplied to the VCM 5 and operate the head arm.

In addition to the above-mentioned retract control unit 11, the analog circuit unit includes a head speed detection unit 12, a shock detection unit 13, a 3.3 V series regulator 14, a switching regulator 15, a negative voltage generation regulator 16, a power monitor 17, a power-on reset unit 18, and a booster 19.

The head speed detection unit 12 is constructed to detect a speed of the head arm to which the VCM 5 is connected. The VCM 5 is controlled based on a speed detected by the head speed detection unit 12. In this manner, the head arm can be controlled accurately. The shock detection unit 13 detects a shock applied to the hard disk apparatus so as to immediately stop the system when there is a shock applied to the hard disk apparatus.

The 3.3V series regulator 14 generates a 3.3 V voltage from a 5 V or 12 V power supply voltage. The switching regulator 15 generates voltages 1.1 V through 2.5 V from the power supply voltage. The negative voltage generation regulator 16 generates a negative voltage from the power supply voltage. Voltages generated from these regulators are supplied to MCU 1, for example. In many cases, systems and voltages for the regulators depend on ICs according to customer specifications.

The power monitor 17 has the function of monitoring whether or not an error occurs in the power supply voltage. When the power supply voltage is subject to a variation smaller than or equal to an allowable range, for example, the power reset unit 18 causes the HDD motor driver IC 2 to output a reset signal to the MCU 1. The booster 19 is a charge pump circuit that generates a voltage higher than or equal to the power supply voltage. The voltage generated in the booster 19 is supplied to the gate electrodes of the power transistors 6 and 7, for example. The voltage generated in the booster 19 is used for circuits in the HDD motor driver IC 2.

In the HDD motor driver IC 2, there are formed the power transistor and the control integrated circuit composed of the logic circuit and the analog circuit. These circuits are formed in one semiconductor chip. The following describes the layout of the semiconductor chip where the HDD motor driver IC 2 is formed.

Figure 2:
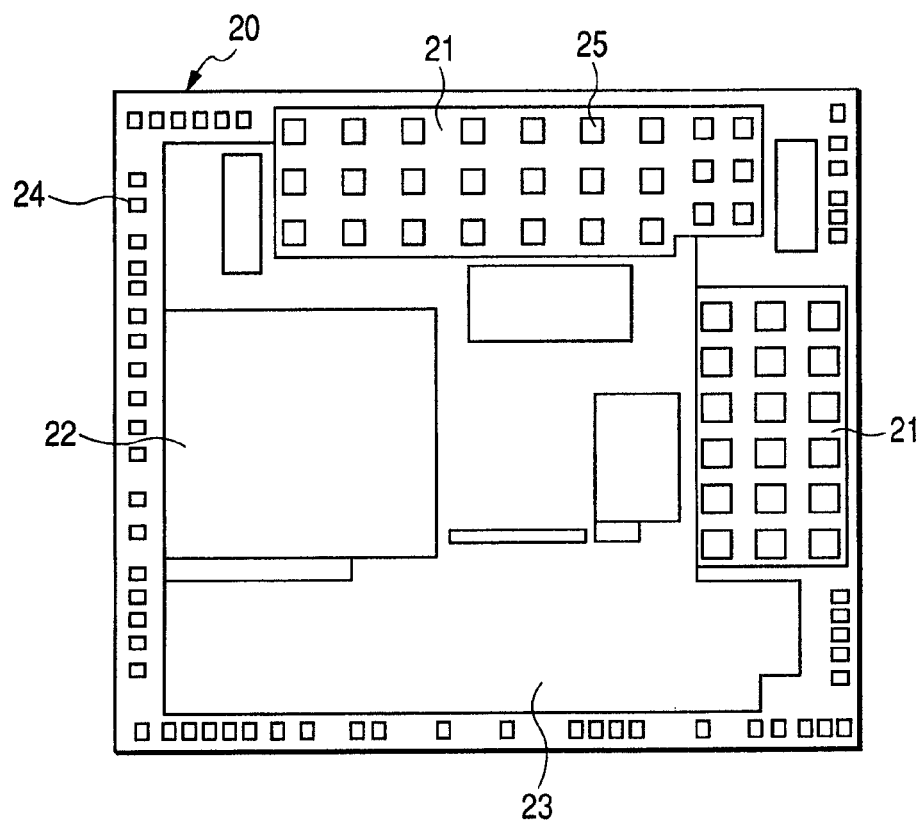
FIG. 2 is a plan view showing a layout example of a semiconductor chip according to an embodiment of the invention.

FIG. 2 shows a layout example of a semiconductor chip 20 where the HDD motor driver IC 2 is formed. As shown in FIG. 2, the semiconductor chip 20 is provided with a power transistor formation region (first region) 21, a logic circuit formation region (second region) 22, and an analog circuit formation region (second region) 23. The power transistor is formed in the power transistor formation region 21. The digital circuit is formed in the logic circuit formation region 22. The analog circuit is formed in the analog circuit formation region 23.

A bonding pad (second bonding pad) 24 is formed along an outside periphery of the semiconductor chip 20. The bonding pad 24 is connected to the logic circuit or the analog circuit, but is not formed on the logic circuit formation region 22 and the analog circuit formation region 23. The reason is as follows. A wire (second conductor) such as a gold wire is bonded to the bonding pad 24. When a device constituting the logic circuit or the analog circuit is formed under the bonding pad 24, a shock during bonding may damage the device. To avoid this, the bonding pad 24 is formed outside the logic circuit formation region 22 and the analog circuit formation region 23.

In the power transistor formation region 21, there is formed a pad (first bonding pad) 25 connected to the power transistor. No device is disposed under the pad 25 when a well-known technology is used to form the pad 25 in the power transistor formation region 21 as shown in FIG. 2. By contrast, the embodiment disposes a device under the pad 25. This is one of the features of the semiconductor device according to the embodiment. The pad 25 is formed in the power transistor formation region 21. The device is formed under the pad 25. This can decrease the area of the semiconductor chip 20. That is, the size of the semiconductor chip 20 can be reduced. It is possible to increase the number of semiconductor chips 20 fabricated from one semiconductor wafer and reduce costs of the semiconductor chip 20. When the pad 25 is formed in the power transistor formation region 21, bonding the pad 25 via a gold wire and the like may damage the power transistor under the pad 25. However, the embodiment avoids the wire bonding via a gold wire and the like for the pads 25 formed in the power transistor formation region 21. That is, the pad 25 formed in the power transistor formation region 21 is connected via a clip (first conductor) having a larger cross section than that of the wire so as to decrease the on-resistance of the power transistor to be described later. Connection via a clip applies no shock to the pad 25 and therefore can suppress damage to the power transistor formed under the pad 25. For this reason, the pad 25 is formed in the power transistor formation region 21 to prevent an area occupied by the pad from increasing.

The pad 25 formed in the power transistor formation region 21 has a larger area than that of the bonding pad 24 formed along the outside periphery of the semiconductor chip 20. This is because increasing an area of connection between the pad 25 and the clip decreases the on-resistance of the power transistor. The minimum pitch interval for the pad 25 is larger than the minimum pitch interval for the bonding pad 24. This is because the cross section of the clip connected to the pad 25 is larger than that of the gold wire (bonding wire) connected to the bonding pad 24 and there is a need to protect the adjacent pads 25 from a short circuit. For this reason, the minimum pitch interval of the pad 25 is larger than that of the bonding pad 24. From another viewpoint, the device for the control integrated circuit connected to the bonding pad 24 has higher integration than that for the power transistor connected to the pad 25. The minimum pitch interval for the bonding pad 24 is smaller than that for the pad 25.

The power transistor has a large influence on the power consumption and is therefore requested to decrease the on-resistance for the semiconductor chip 20. Accordingly, the embodiment increases the area of the pad 25 to be connected to the power transistor and uses the clip having a large cross section for connection. On the other hand, it is requested to increase the integration of the control integrated circuit composed of the logic circuit and the analog circuit. For this reason, the embodiment decreases the size of the bonding pad 24 to be connected to the control integrated circuit and decreases the minimum pitch interval. Since the bonding pad 24 to be connected to the control integrated circuit is formed to be small, the gold wire (bonding wire) having a small cross section is used for connection to prevent a short circuit between the adjacent bonding pads 24.

Figure 3:
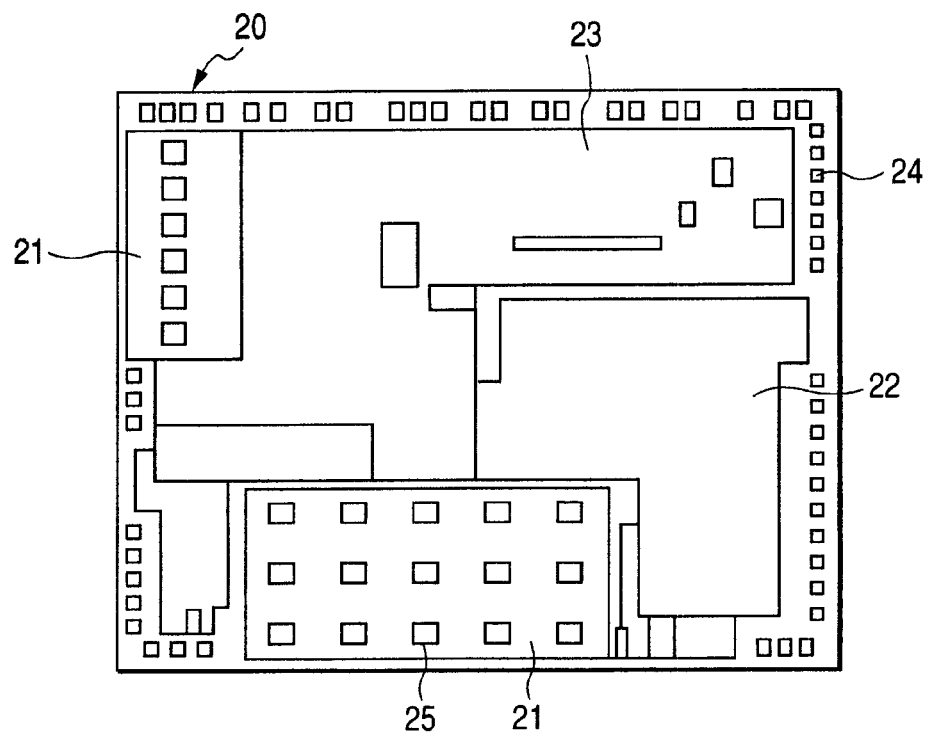
FIG. 3 is a plan view showing another layout example of the semiconductor chip.

FIG. 3 shows another layout example of the semiconductor chip 20. Also in FIG. 3, there are formed the power transistor formation region 21, the logic circuit formation region 22, and the analog circuit formation region 23 on the semiconductor chip 20. The power transistor, the logic circuit, and the analog circuit are formed in the corresponding formation regions. Similarly to FIG. 2, the bonding pad 24 is formed along the outside periphery of the semiconductor chip 20, and the pad 25 is formed in the power transistor formation region 21. The bonding pad 24 is connected to the control integrated circuit composed of the logic circuit and the analog circuit. The pad 25 is connected to the power transistor.

Also according to the layout in FIG. 3, the pad 25 is formed in the power transistor formation region 21 so as to reduce the size of the semiconductor chip 20. The area of the pad 25 is sized larger than that of the bonding pad 24. In addition, a clip is used to connect the pad 25. In this manner, the on-resistance of the power transistor can be decreased.

Figure 4:
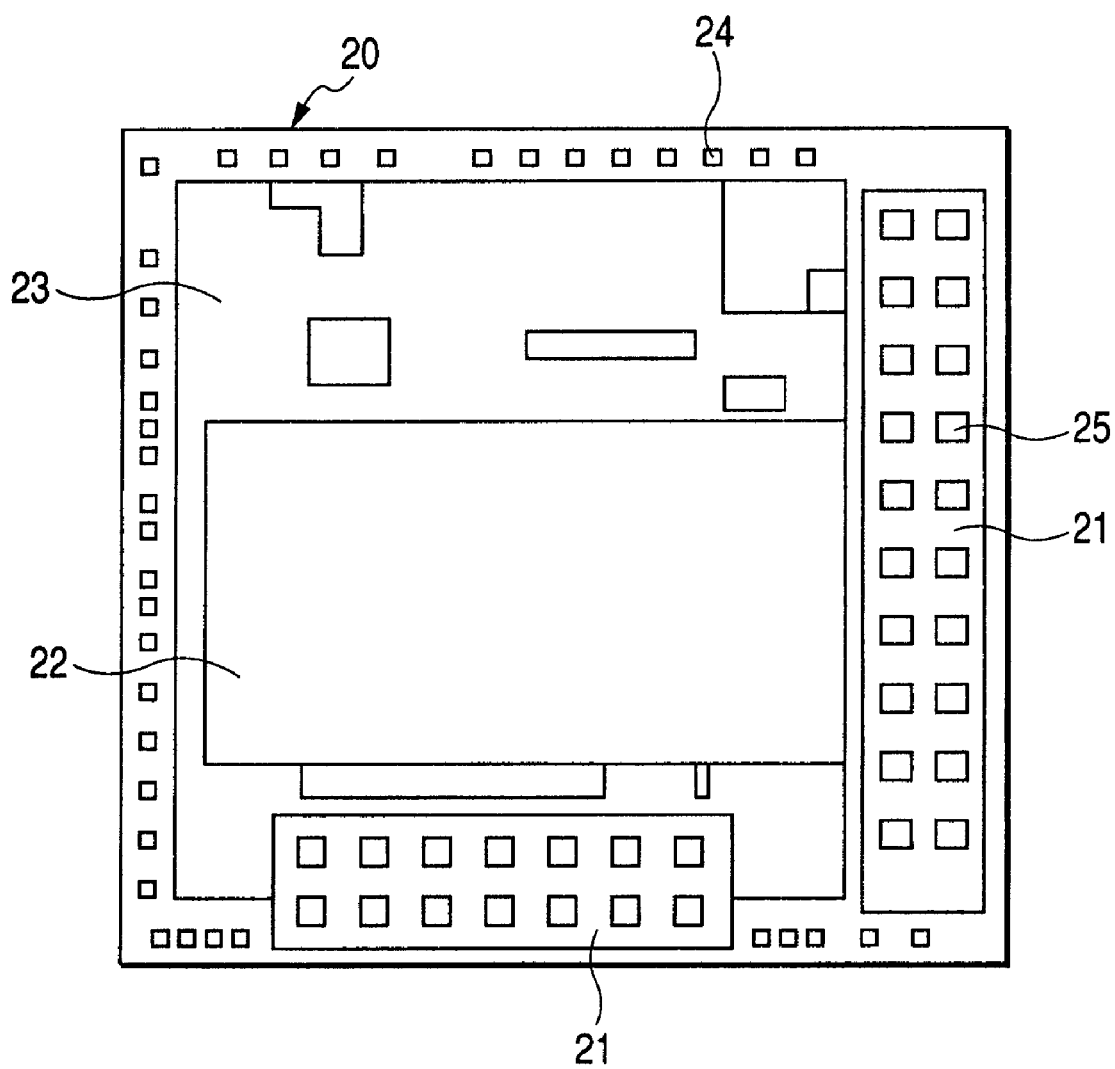
FIG. 4 is a plan view showing still another layout example of the semiconductor chip.

FIG. 4 is a plan view showing still another layout example of the semiconductor chip 20. The semiconductor chip 20 in FIG. 4 is constructed similarly to those shown in FIGS. 2 and 3 but differs from them in the arrangement of constituent elements. Also in FIG. 4, the pad 25 is formed in the power transistor formation region 21 so as to reduce the size of the semiconductor chip 20. The area of the pad 25 is sized larger than that of the bonding pad 24. In addition, a clip is used to connect the pad 25. In this manner, the on-resistance of the power transistor can be decreased.

As shown in FIGS. 2 through 4, various layouts are available for the semiconductor chip 20 depending on applicable products. In any case, the layout is capable of reducing the size of the semiconductor chip 20 and decreasing the power transistor's on-resistance.

Figure 5:
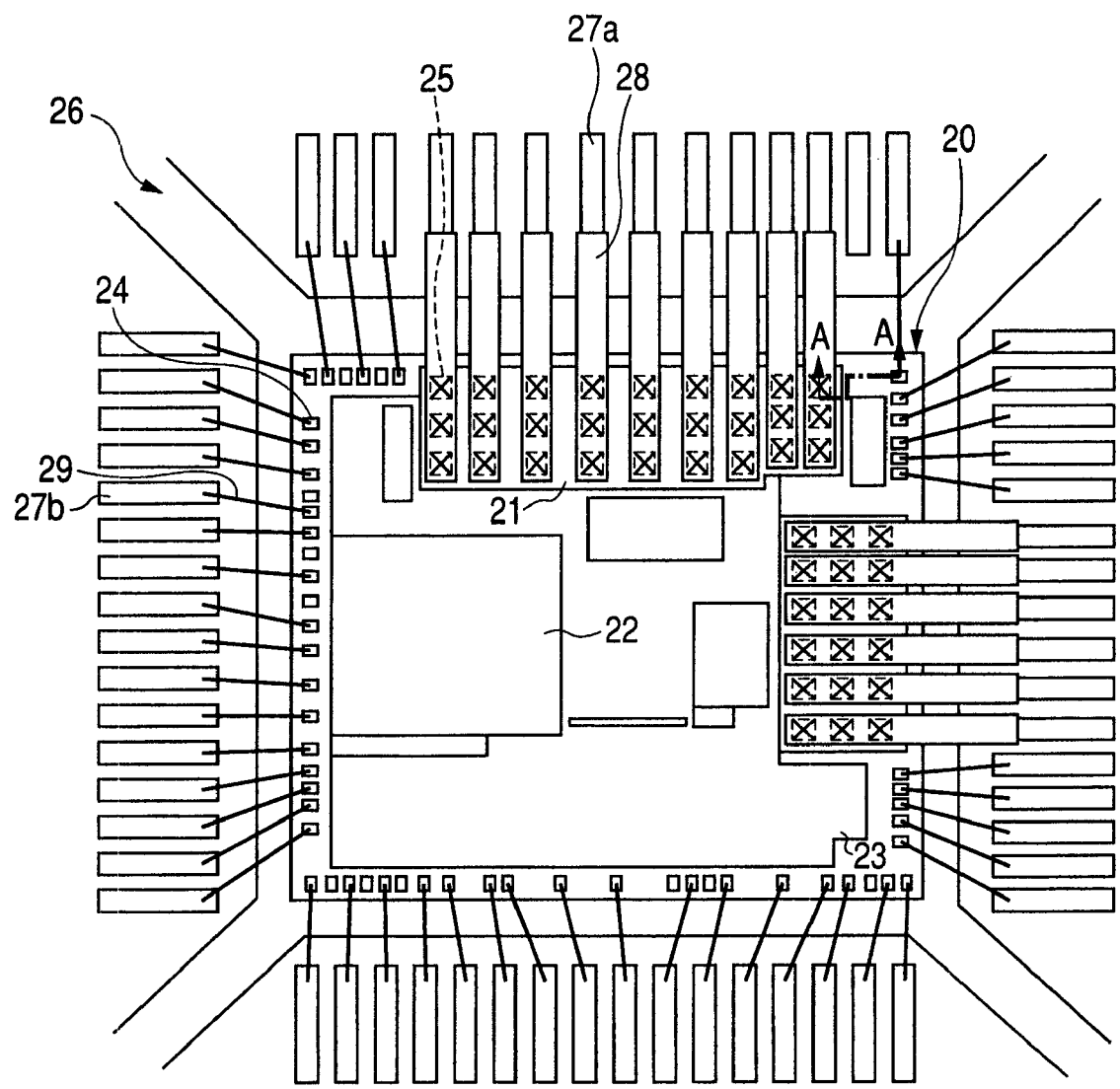
FIG. 5 is a plan view showing an example of mounting the semiconductor chip on a lead frame.

FIG. 5 shows an example of mounting the semiconductor chip 20 shown in FIG. 2 on a lead frame 26. As shown in FIG. 5, the pad 25 is formed in the power transistor formation region 21 of the semiconductor chip 20. A clip 28 is used to connect the pad 25 with a lead (first lead) 27a formed in the lead frame 26. In addition, the bonding pad 24 is formed along the outside periphery of the semiconductor chip 20. A wire 29 is used to connect the bonding pad 24 with a lead (second lead) 27b formed in the lead frame 26.

Since the clip 28 is used to connect the pad 25 with the lead 27a, it is possible to decrease the on-resistance of the power transistor connected to the pad 25. That is, the area of the pad 25 is formed larger than that of the bonding pad 24. The pad 25 and the lead 27a are connected to each other via the clip 28 whose cross section is larger than that of the wire 29. This makes it possible to decrease the connection resistance between the pad 25 and the lead 27a. Accordingly, it is possible to decrease the on-resistance of the power transistor connected to the pad 25.

Conventionally, a wire is used to connect a bonding pad to the power transistor. However, since the wire has a small cross section, the connection resistance between the bonding pad and the lead increases the power transistor's on-resistance. A large on-resistance for the power transistor increases the power consumption for the entire semiconductor device.

To address this problem, the embodiment uses the clip 28 instead of the wire to connect the pad 25 with the lead 27a to be connected to the power transistor. The clip 28 has a larger cross section than that of the wire. The resistance is in inverse proportion to the cross section size. The use of the clip 28 having a large cross section can decrease the power transistor's on-resistance. Materials for the clip 28 can include, for example, copper and aluminum whose resistivity is relatively small.

The embodiment uses the clip 28 to connect the pad 25 to the lead 27a. Connection via the clip 28 can prevent a bonding damage resulting from connection via the wire. Even when the pad 25 is formed immediately over the power transistor formation region where the power transistor is formed, connection via the clip 28 gives no damage to the power transistor. Accordingly, the pad 25 can be arranged in the power transistor formation region. For this reason, the size of the semiconductor chip 20 can be reduced in comparison with the case of arranging the pad 25 outside the power transistor formation region. Since the embodiment uses the clip 28 to connect the pad 25 to the lead 27a to be connected to the power transistor, it is possible to not only decrease the power transistor's on-resistance, but also reduce the semiconductor chip size.

The embodiment can decrease the resistivity for the connection between the pad 25 and the lead 27a. Therefore, it is also possible to improve the integration scale of the power transistor itself when the on-resistance for the entire power transistor circuit is kept to be a specified value. That is, since it is possible to decrease the resistivity for the connection between the pad 25 and the lead 27a, the on-resistance does not exceed the specified value even when the integration of the power transistor itself (including wiring) is increased. Generally, decreasing the device constant, i.e., the area of the power transistor itself increases the on-resistance. However, the embodiment can decrease the resistivity for the connection between the pad 25 and the lead 27a. The power transistor area can be reduced as the resistivity decreases. In this manner, the power transistor integration can be improved and the semiconductor chip 20 can be reduced without increasing the on-resistance from a specified value. When the on-resistance need not be decreased too much, the embodiment can further reduce the semiconductor chip 20 to decrease costs.

The wire 29 made of a gold wire, for example, is used to connect the bonding pad 24 and the lead 27b formed along the outside periphery of the semiconductor chip 20. The bonding pad 24 is connected to the logic circuit and the analog circuit (control integrated circuit). The bonding pad 24 may be subject to a bonding damage when the wire 29 is connected. For this reason, the bonding pad 24 is formed outside the control integrated circuit formation region composed of the logic circuit formation region 22 and the analog circuit formation region 23.

The control integrated circuit requires many I/O pins, i.e., bonding pads so as to respond to demands of the market for versatile functions. For this reason, it is necessary to improve the integration between bonding pad intervals. Accordingly, the wire 29 having a small cross section is used to connect the bonding pad 24 with the lead 27b. When a clip is used to connect the bonding pad 24 with the lead 27b, the clip has a large cross section, necessitating enlarging the interval between the adjacent bonding pads 24. Consequently, the size of the semiconductor chip 20 increases, making it difficult to improve the integration. As a solution for this, the wire 29 having a small cross section is used to connect the bonding pad 24 with the lead 27b to maintain the integration.

The power transistor needs to decrease its on-resistance. The control integrated circuit needs to improve its integration. When the power transistor and the control integrated circuit need to be formed into one semiconductor chip, the embodiment uses the clip having a large cross section to connect the power transistor and uses the wire to connect the control integrated circuit. In this manner, the power transistor's on-resistance can be decreased and the semiconductor chip size can be reduced. From the viewpoint of reducing the semiconductor chip size, it is necessary to improve the integration of the power transistor and the control integrated circuit. From the viewpoint of decreasing the power transistor's on-resistance, however, it is desirable not to increase the power transistor integration. As mentioned above, the contradictory requirements can be resolved by using the clip for the power transistor connection and using the wire for the control integrated circuit connection. Therefore, the semiconductor device according to the embodiment can satisfy the contradictory requirements at the same time and are highly practical and useful.

Figure 6:
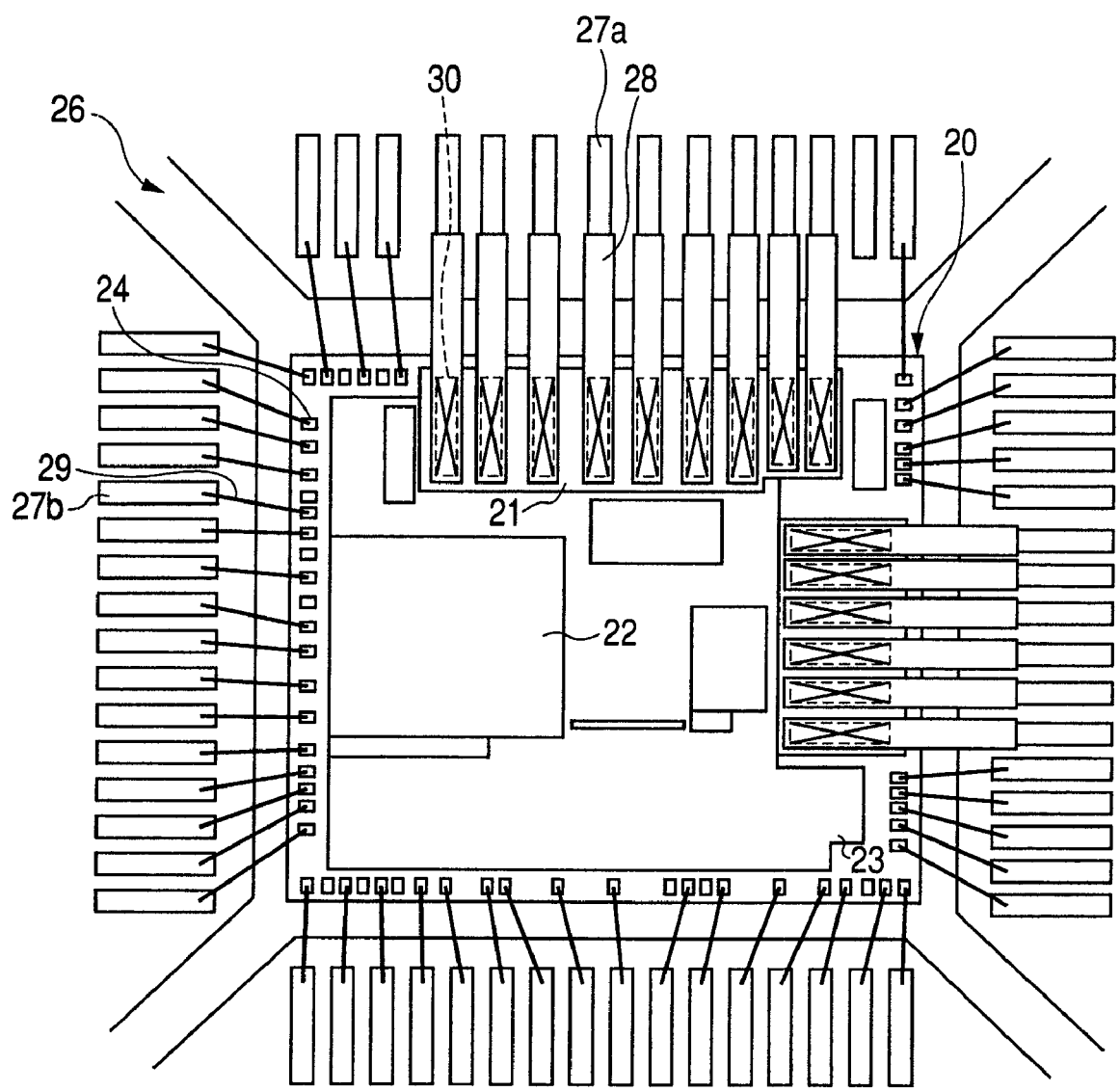
FIG. 6 is a plan view showing another example of mounting the semiconductor chip on a lead frame.

FIG. 6 shows another example of mounting the semiconductor chip 20 on the lead frame 26. FIG. 6 differs from FIG. 5 as follows. In FIG. 5, one clip 28 is used to connect the multiple pads 25 (three pads in FIG. 5) to one lead 27a. In FIG. 6, one pad 30 is formed instead of the multiple pads 25. The pad 30 has a larger area than that of the multiple pads 25. The clip 28 is used to connect the pad 30 with the lead 27a. According to this construction, the area of the pad 30 becomes larger than the total area of the multiple pads 25, further decreasing the connection resistance between the pad 30 and the lead 27a. In addition, it is possible to improve the effect of decreasing the wiring resistance on the chip, further decreasing the power transistor's on-resistance.

Figure 7:
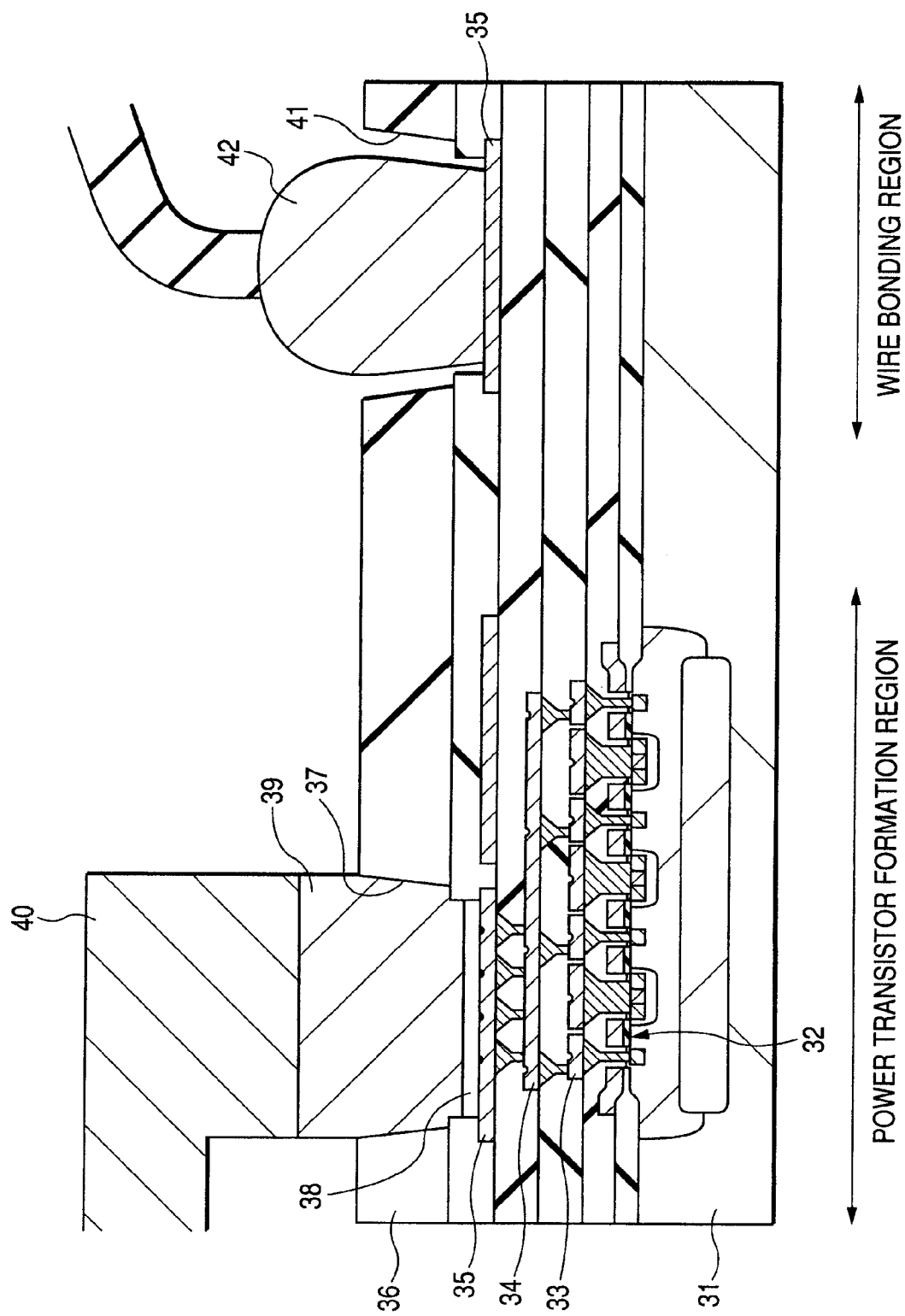
FIG. 7 is a cross sectional view taken along lines A—A of FIG. 5.

FIG. 7 is a cross sectional view taken along lines A—A of FIG. 5. As shown in FIG. 7, a power transistor 32 is formed in the power transistor formation region of a semiconductor substrate 31. A first wiring 33 is formed on the power transistor 32 via an interlayer insulation film. The power transistor 32 and the first wiring is electrically connected via a plug formed in the interlayer insulation film. A second wiring 34 is formed over the first wiring 33 via an interlayer insulation film. A third wiring 35 (bonding pad) is formed over the first wiring 34 via an interlayer insulation film. The plugs are used to connect the first wiring 33 with the second wiring 34 and connect the second wiring 34 with the third wiring 35. A passivation film 36 is formed above the wiring 35 and functions as a surface protection film. The passivation film 36 is provided with an aperture 37 that exposes the third wiring 35. A surface treatment film 38 is formed above the third wiring 35 exposed from the aperture 37. The surface treatment film 38 is a multilayer film composed of nickel, gold, and palladium films. A connection material 39 is formed above the surface treatment film 38. The surface treatment film 38 is formed to improve the connectivity between the connection material 39 and the third wiring 35. The connection material 39 is made of solder or conductive resin paste. A clip 40 is connected to the connection material 39. That is, the third wiring 35 as a bonding pad is electrically connected to the clip 40 via the connection material 39. According to the embodiment, the clip 40 is formed immediately above the power transistor 32. The embodiment can reduce the semiconductor chip size compared with the case of forming the clip 40 in a region outside the power transistor formation region.

The third wiring (bonding pad) 35 is formed in the wire bonding region. No device or wiring is formed below the third wiring 35. The passivation film 36 is formed above the third wiring 35 where an aperture 41 is formed to open it. The third wiring 35 is exposed at the bottom of the aperture 41. A wire 42 made of a gold wire, for example, is connected to the third wiring 35 exposed from the aperture 41. Since the wire bonding region is damaged during wire bonding, no device or wiring is formed in the wire bonding region.

Figure 8:
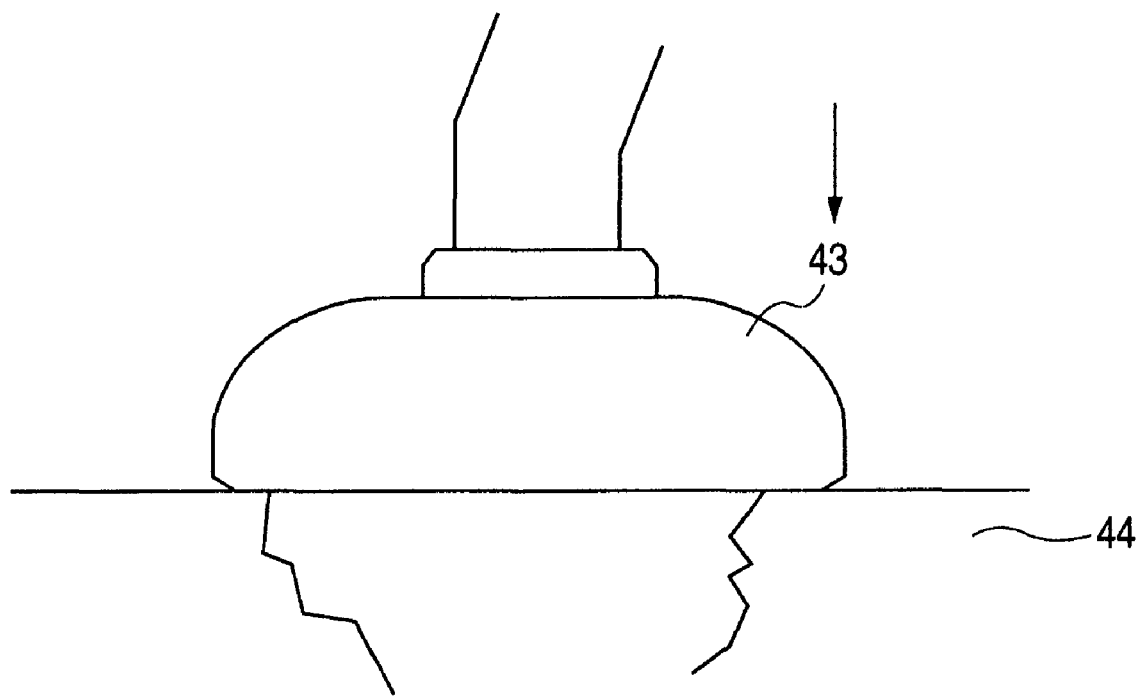
FIG. 8 illustrates wire bonding.
Figure 9:
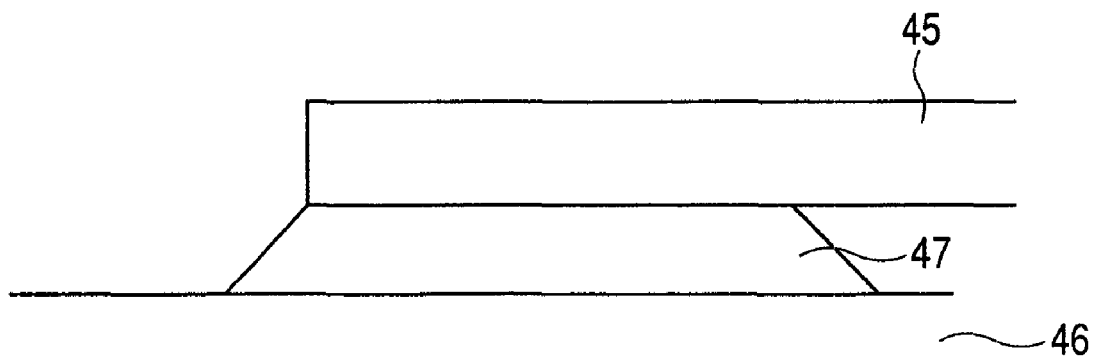
FIG. 9 illustrates clip bonding.

Referring now to FIGS. 8 and 9, the following describes why no device or wiring is formed in the wire bonding region and the power transistor is formed below the formation region of the clip 40.

FIG. 8 shows the use of a gold wire 43 for wire bonding to the bonding pad 44. When the wire 43 is connected to the bonding pad 44 in FIG. 8, for example, a thermal load of 200° C. through 250° C. is applied and an ultrasonic sound of 1 W or less is applied. A bonding tool is used to apply a load of 20 g through 50 g for bonding. At this time, the bonding tool applies the load that may damage the semiconductor substrate where the bonding pad 44 is formed. When a device is formed below the wire bonding region, the wire bonding may damage and destroy the device. Differently from discrete transistors, the IC technology puts a stress on improvement of the entire chip integration even though the power transistor formation region is enlarged to some extent. For this purpose, the thin film AL process is employed to realize fine wiring and improve the integration of the control integrated circuit. The wiring and device are finely processed and are easily damaged. Consequently, no device is formed below the wire bonding region. The control integrated circuit is formed in the other regions.

FIG. 9 shows the use of a clip 45 for connection to a pad 46. In FIG. 9, the clip 45 and the pad 46 are connected to each other via a connection material 47. As the connection material, solder may be used to apply a thermal load of 300° C. through 350° C. Alternatively, conductive resin paste may be used to apply a thermal load of 150° C. through 200° C. Differently from the wire bonding, no load is applied to mount the clip 45 on the connection material 47. Since no load is applied to the clip 45, no damage is applied to the semiconductor substrate where the pad 46 is formed. When the power transistor is formed below the clip 45, no damage is applied to the power transistor.

For this reason, no device or wiring is formed in the wire bonding region and the power transistor is formed below the formation region of the clip 45. Reinforcement against damage may be provided by forming multiple plugs for connection with the third wiring 35, a lower-layer wiring, as a bonding pad for the wire bonding region. The control integrated circuit can be formed below the wire bonding region. In this case, the semiconductor chip can be further miniaturized.

FIG. 7 illustrates the power transistor formation region and the wire bonding formation region. The semiconductor chip provided with an HDD motor driver IC also includes a control integrated circuit formation region. The control integrated circuit is formed in the control integrated circuit formation region. Specifically, there are formed transistors composed of MOSFET (MISFET), resistors, and bipolar transistors, and wirings composed of metal films in the control integrated circuit. Let us compare a power transistor formed in the power transistor formation region with a transistor formed in the control integrated circuit formation region. The power transistor formed in the power transistor formation region has the minimum gate length that is greater than or equal to that of the transistor formed in the control integrated circuit formation region. The power transistor formation region has the minimum gate width that is greater than that of the control integrated circuit formation region. This is because the integration of the control integrated circuit is higher than the power transistor. For the same reason, the wiring formed in the power transistor formation region has the width and the minimum interval that are greater than those of the wiring formed in the control integrated circuit formation region.

Figure 10:
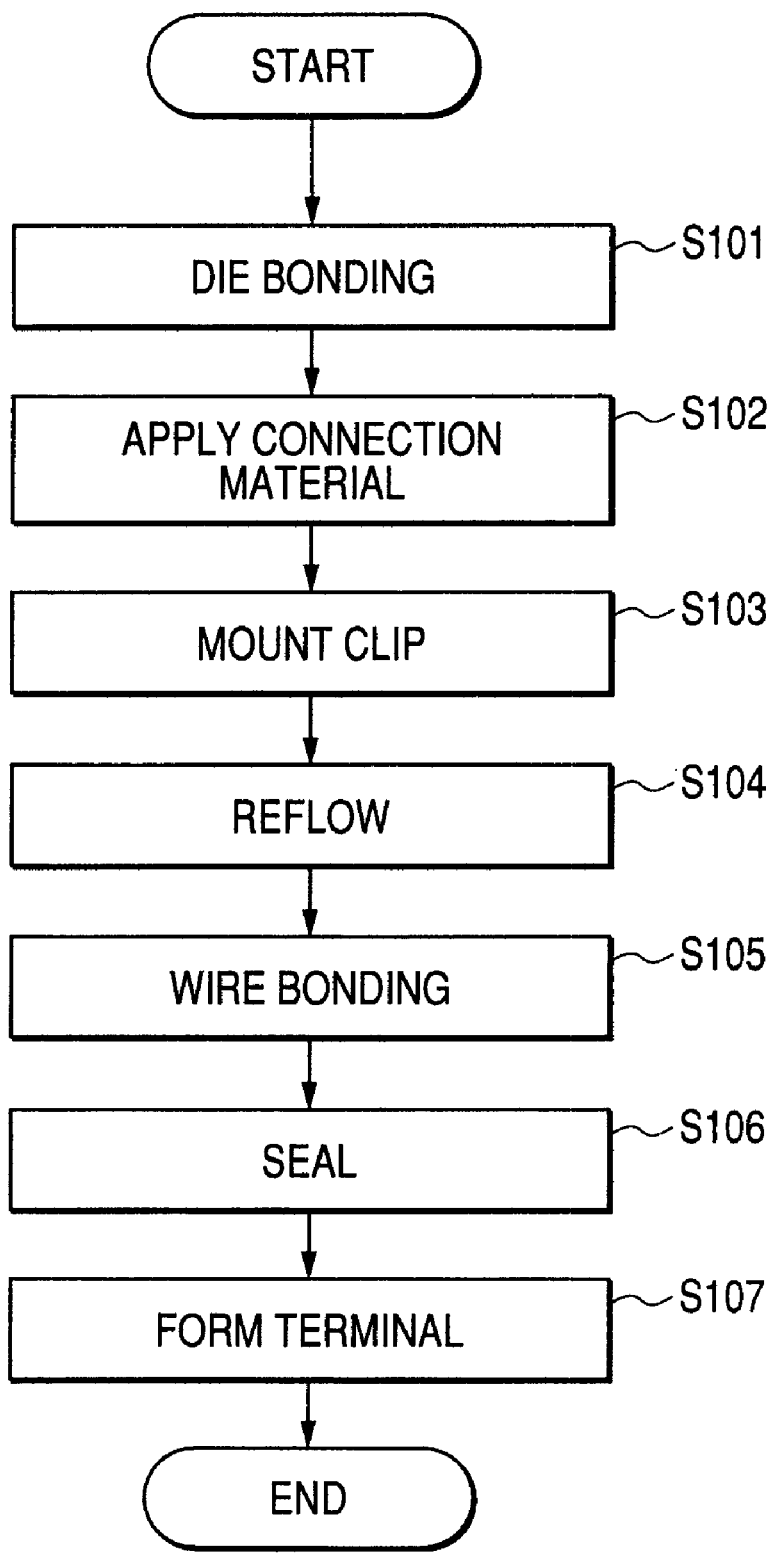
FIG. 10 is a flowchart showing a manufacturing process of a semiconductor device according to an embodiment of the invention.

Referring now to the drawings, the following describes a manufacturing method for the semiconductor device according to the embodiment. FIG. 10 is a flowchart showing a manufacturing process of the semiconductor device according to the embodiment.

Figure 11:
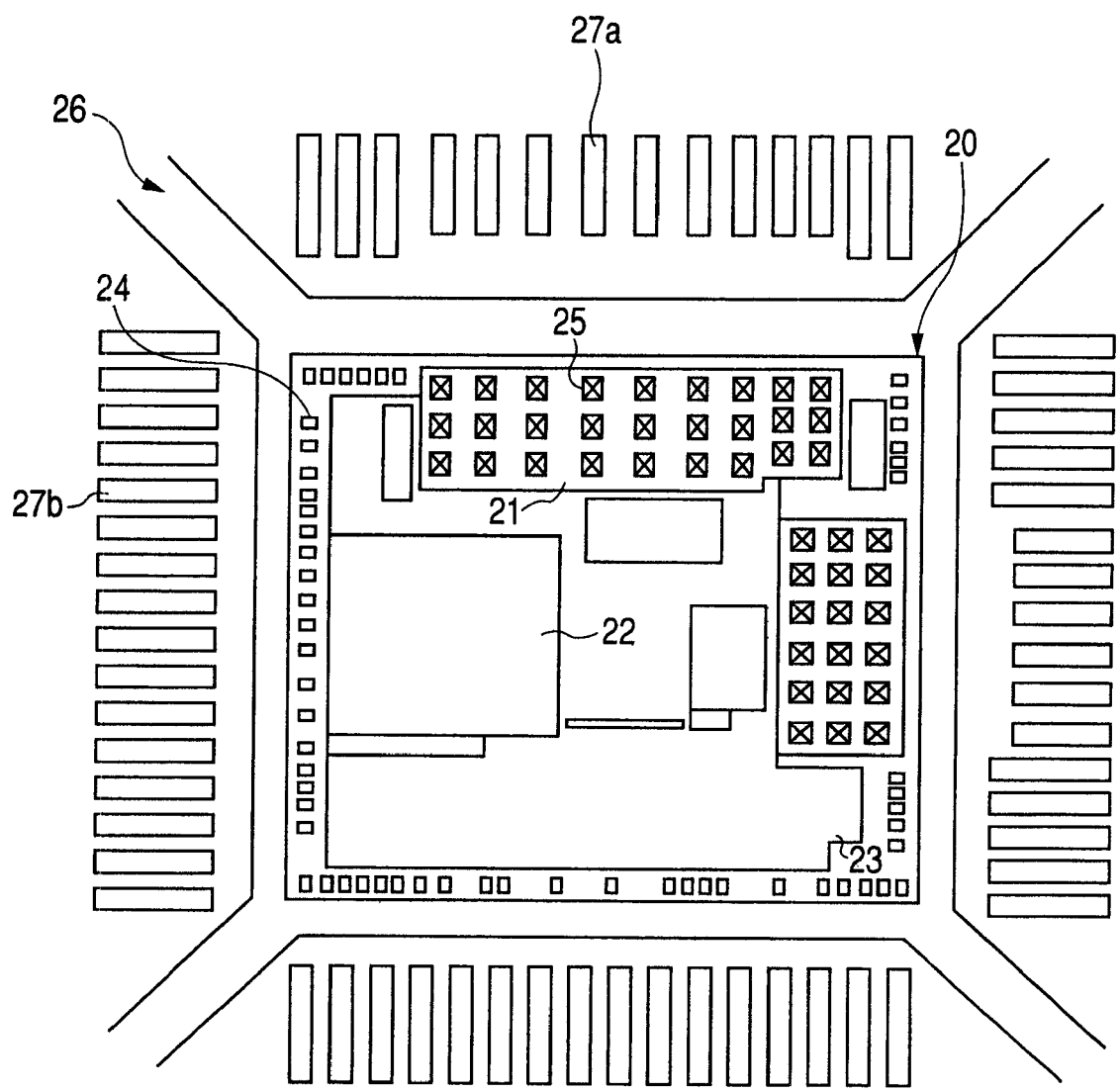
FIG. 11 is a plan view diagramatically showing the manufacturing process of the semiconductor device according to the embodiment of the invention.

As shown in FIG. 11, the semiconductor chip 20 is mounted on the lead frame 26 where multiple leads 27a and 27b are formed (Step S101 in FIG. 10). At this time, the control integrated circuit formation region is formed in the semiconductor chip 20 and includes the power transistor formation region 21, the logic circuit formation region 22, and the analog circuit formation region 23. The power transistor, the logic circuit, and the analog circuit are formed in the respective regions. Along the outside periphery of the semiconductor chip 20, there is formed the bonding pad 24 to be connected to the logic circuit or the analog circuit. The pad 25 is formed in the power transistor formation region and is connected to the power transistor. That is, devices such as the power transistor are formed immediately below the pad 25. The pad 25 has an area greater than that of the bonding pad 24.

A connection material is applied to the pad 25 formed in the power transistor formation region and to the lead 27a connected to the pad 25 (Step S102 in FIG. 10). The connection material is made of solder or conductive resin paste, for example. Before forming the connection material, a surface treatment film may be formed to improve adhesiveness between the connection material, the pad 25, and the lead 27a. The surface treatment film is a multilayer film composed of nickel, gold, and palladium films, for example.

Figure 12:
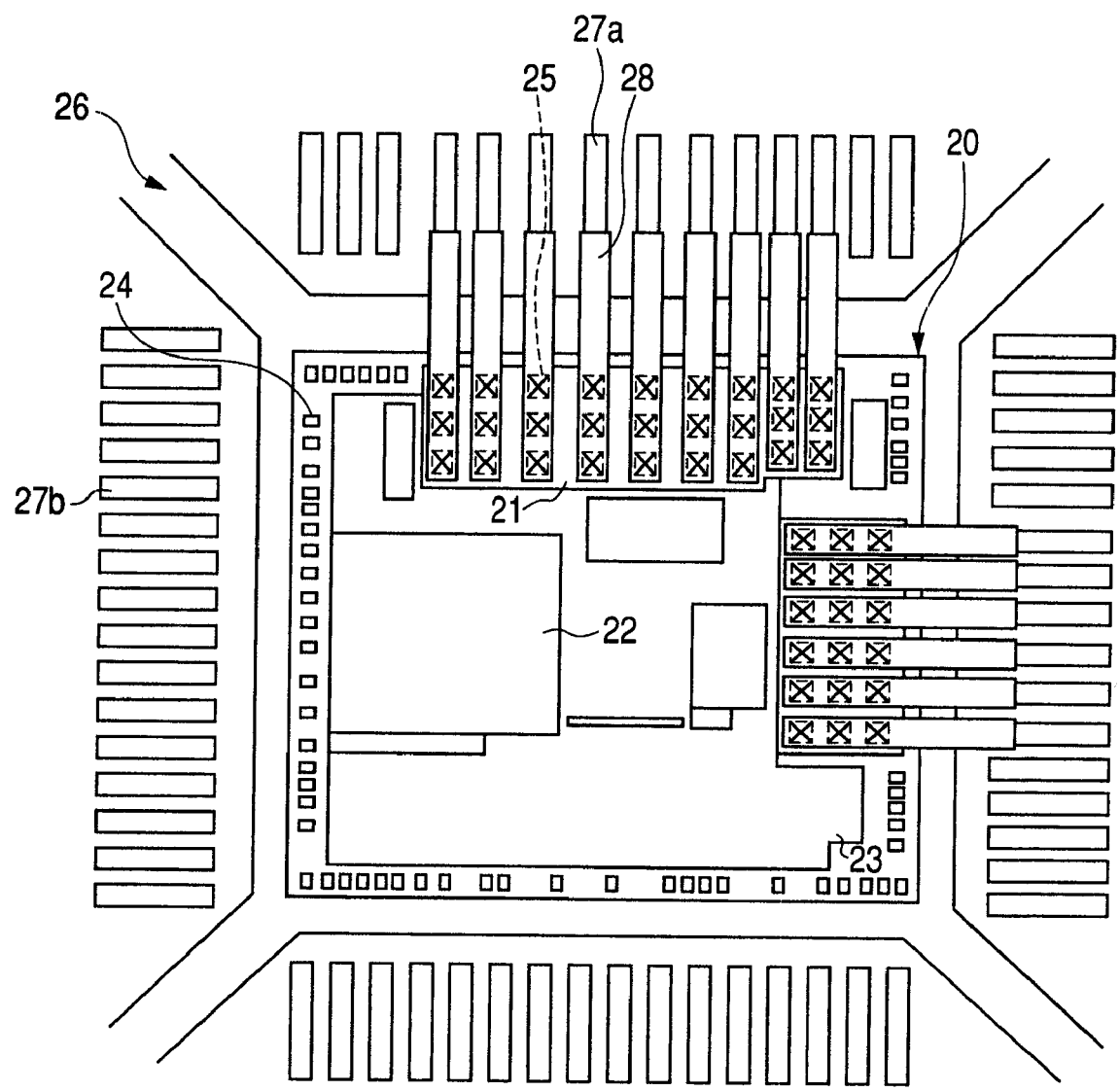
FIG. 12 is a plan view continued from FIG. 11 diagramatically showing the manufacturing process of the semiconductor device.

As shown in FIG. 12, the clip 28 is mounted on the pad 25 applied with the connection material and on the lead 27a applied with the connection material (Step S103 in FIG. 10). In this manner, the clip 28 electrically connects the pad 25 with the lead 27a. The clip 28 has a cross section greater than that of the wire and can decrease the resistivity at the connection between the pad 25 and the lead 27a. This makes it possible to decrease the on-resistance of the power transistor connected to the pad 25. The clip 28 is made of a member having low resistivity such as copper and aluminum.

A reflow process is then applied to the semiconductor chip 20 mounted on the lead frame 26 to connect the connection material, the pad 25, and the lead 27a (Step S104 in FIG. 10). The reflow process is performed when the connection material is solder. The heat treatment temperature ranges from 300° C. to 350° C., for example. When the connection material is conductive paste, a baking process is performed instead of the reflow process. The heat treatment temperature ranges from 150° C. to 200° C., for example.

Figure 13:
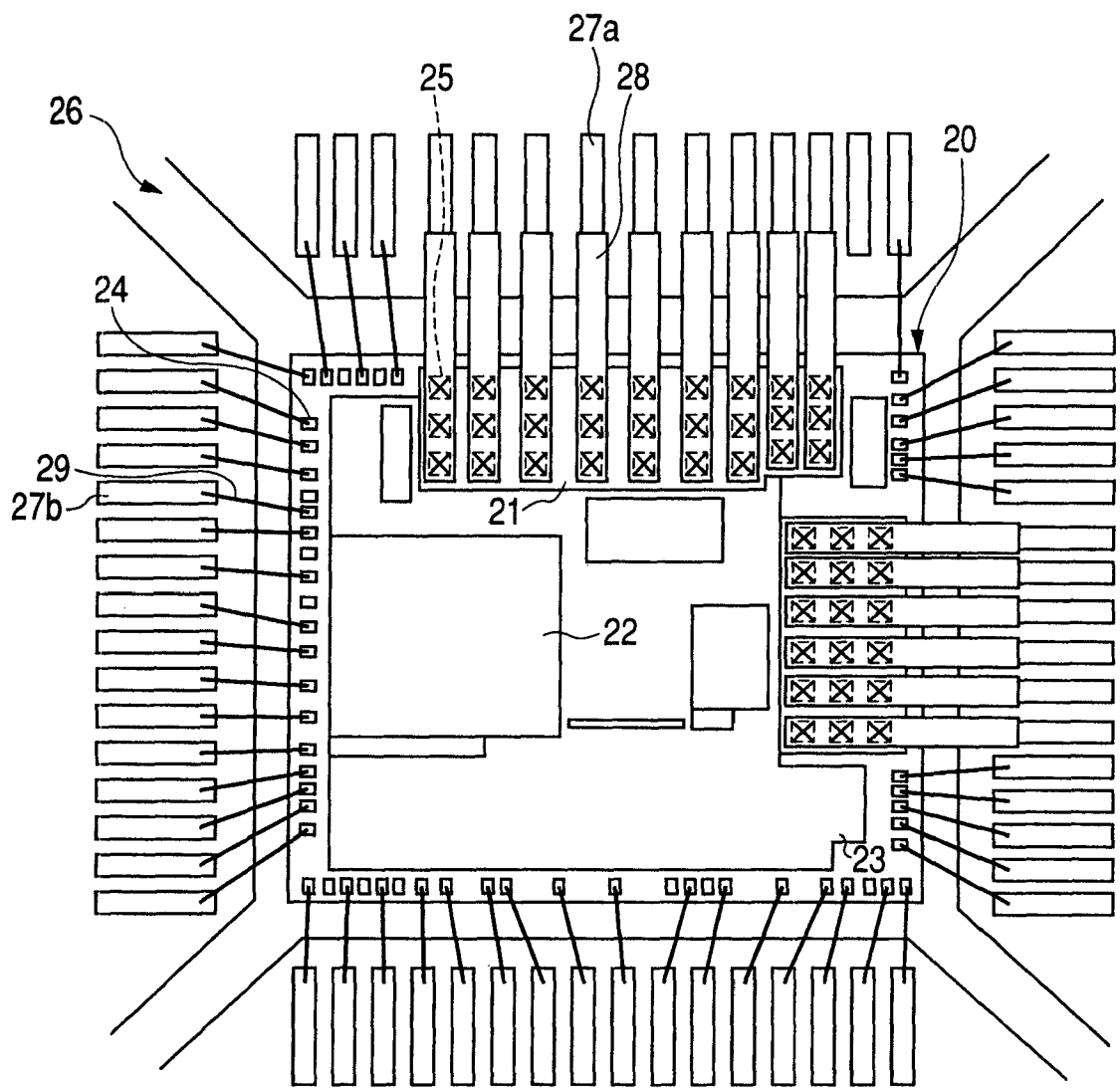
FIG. 13 is a plan view continued from FIG. 12 diagramatically showing the manufacturing process of the semiconductor device.

As shown in FIG. 13, the wire 29 is used to connect the bonding pad 24 and the lead 27b formed along the outside periphery of the semiconductor chip 20 (Step S105 in FIG. 10). The resin is applied to the semiconductor chip 20 to seal it (Step S106 in FIG. 10). According to the embodiment, some parts use the clip 28 having higher rigidity than the wire 29 for connection. When the resin is applied to the semiconductor chip 20, the clip 28 can be protected against deformation due to application of the resin in the power transistor formation region connected by the clip 28. It is possible to prevent a short circuit between the adjacent clips 28 due to deformation of the clip 28. Thereafter, terminals are formed by the leads 27a and 27b exposed from the resin-sealed portion (Step S107 in FIG. 10).

Figure 14:
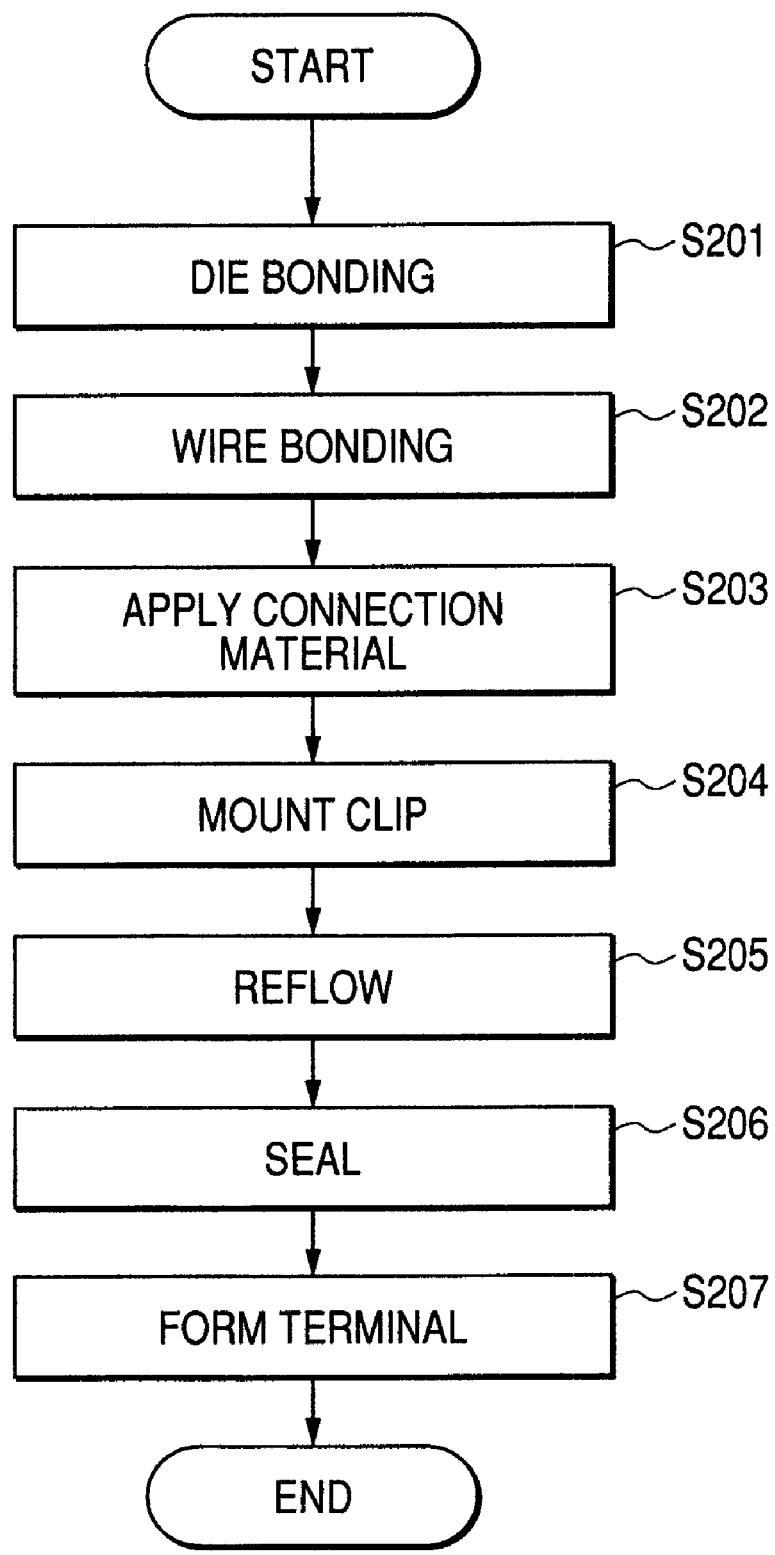
FIG. 14 is a flowchart showing a manufacturing process different from that in FIG. 10.

In this manner, it is possible to form the semiconductor device according to the embodiment. It may be preferable to use the following procedure to manufacture the semiconductor device according to the embodiment when the gold wire formed by the wired bonding process causes no hindrance to the thermal load or transport during the clip connection. While the clip is connected and then the wire bonding is performed according to the above-mentioned embodiment, the wire bonding may be performed and then the clip may be connected. FIG. 14 is a flowchart showing a manufacturing process different from that in FIG. 10.

Figure 15:
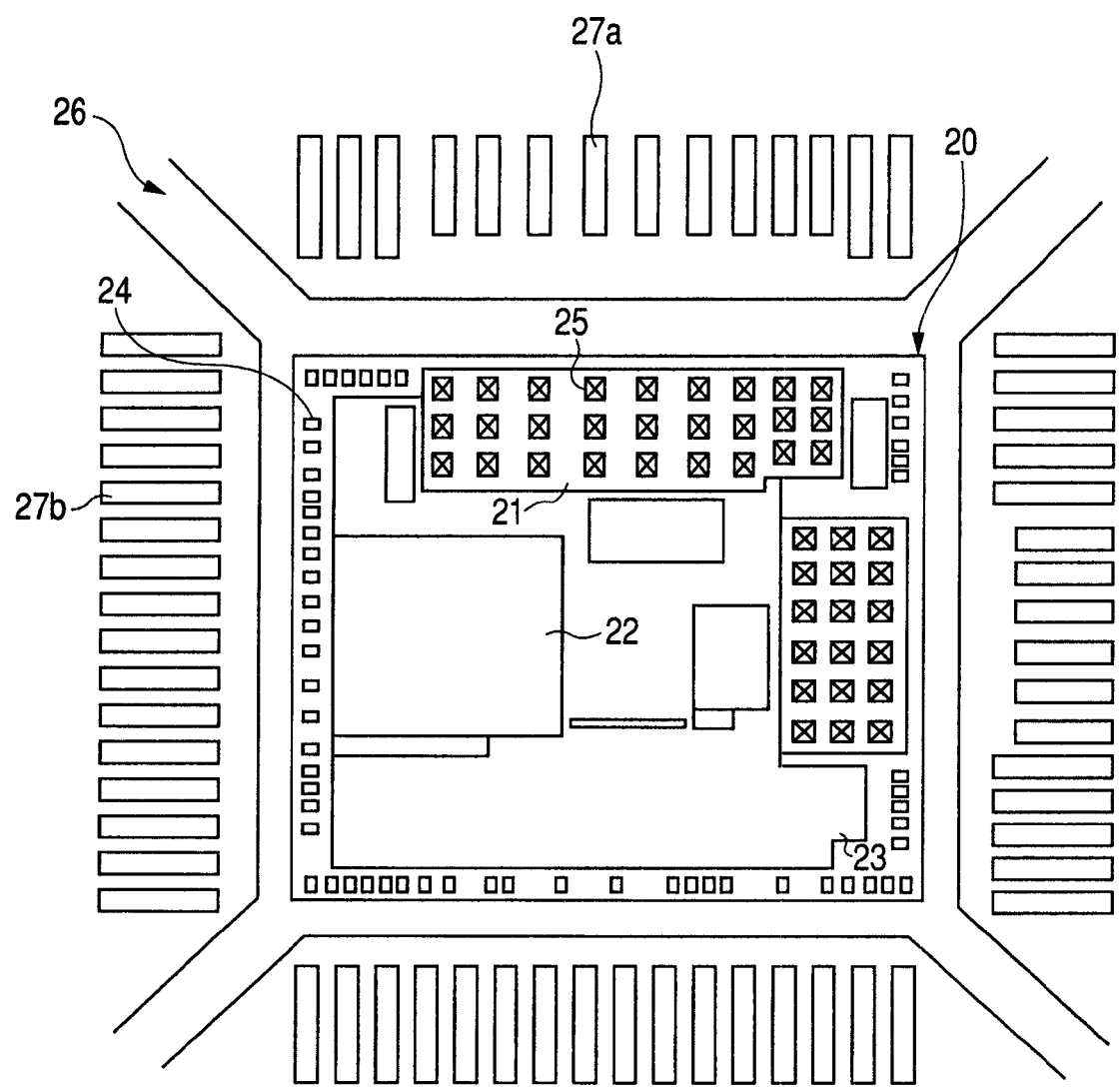
FIG. 15 is a plan view diagramatically showing the manufacturing process of the semiconductor device according to the embodiment.
Figure 16:
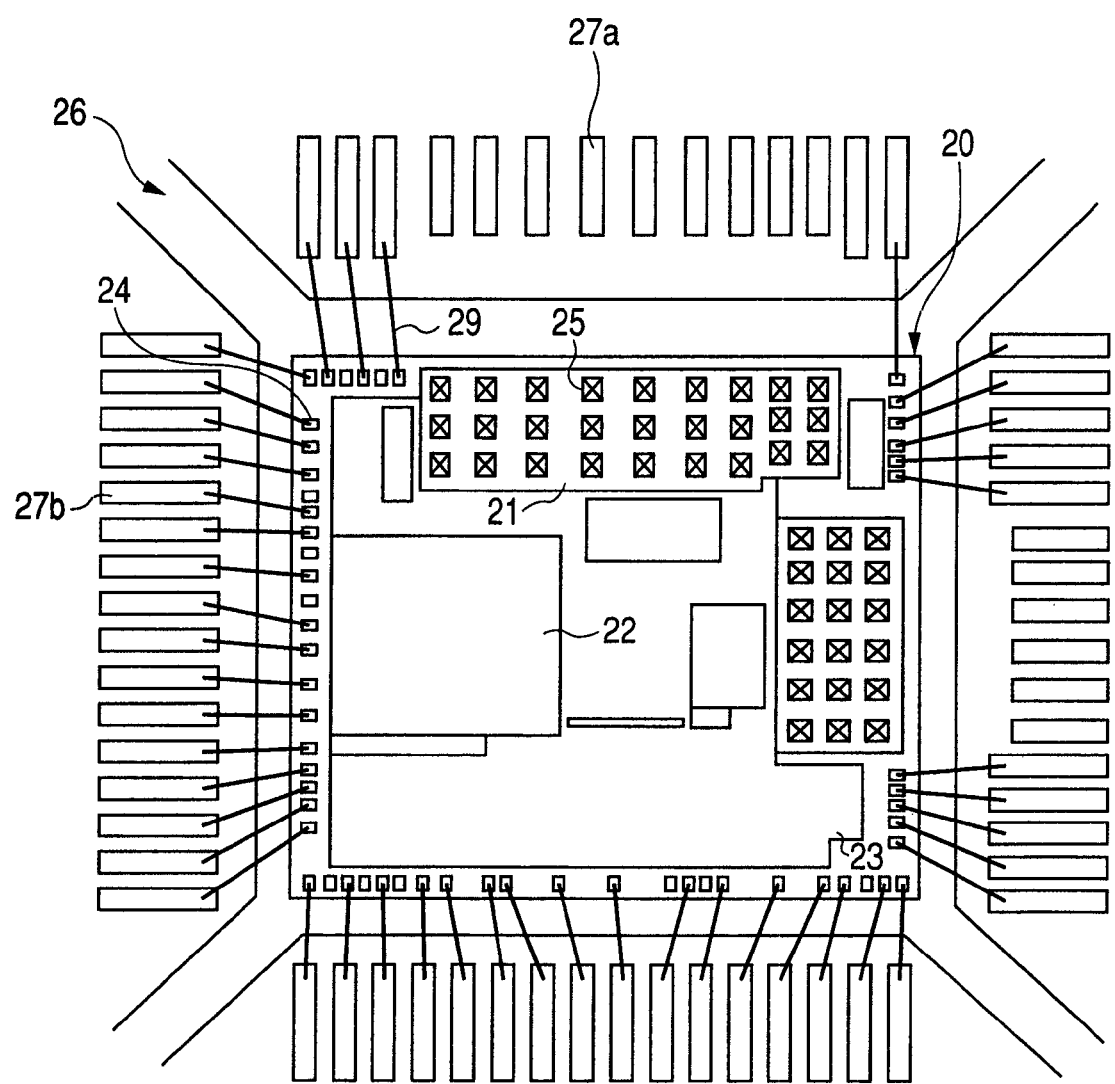
FIG. 16 is a plan view continued from FIG. 15 diagramatically showing the manufacturing process of the semiconductor device.
Figure 17:
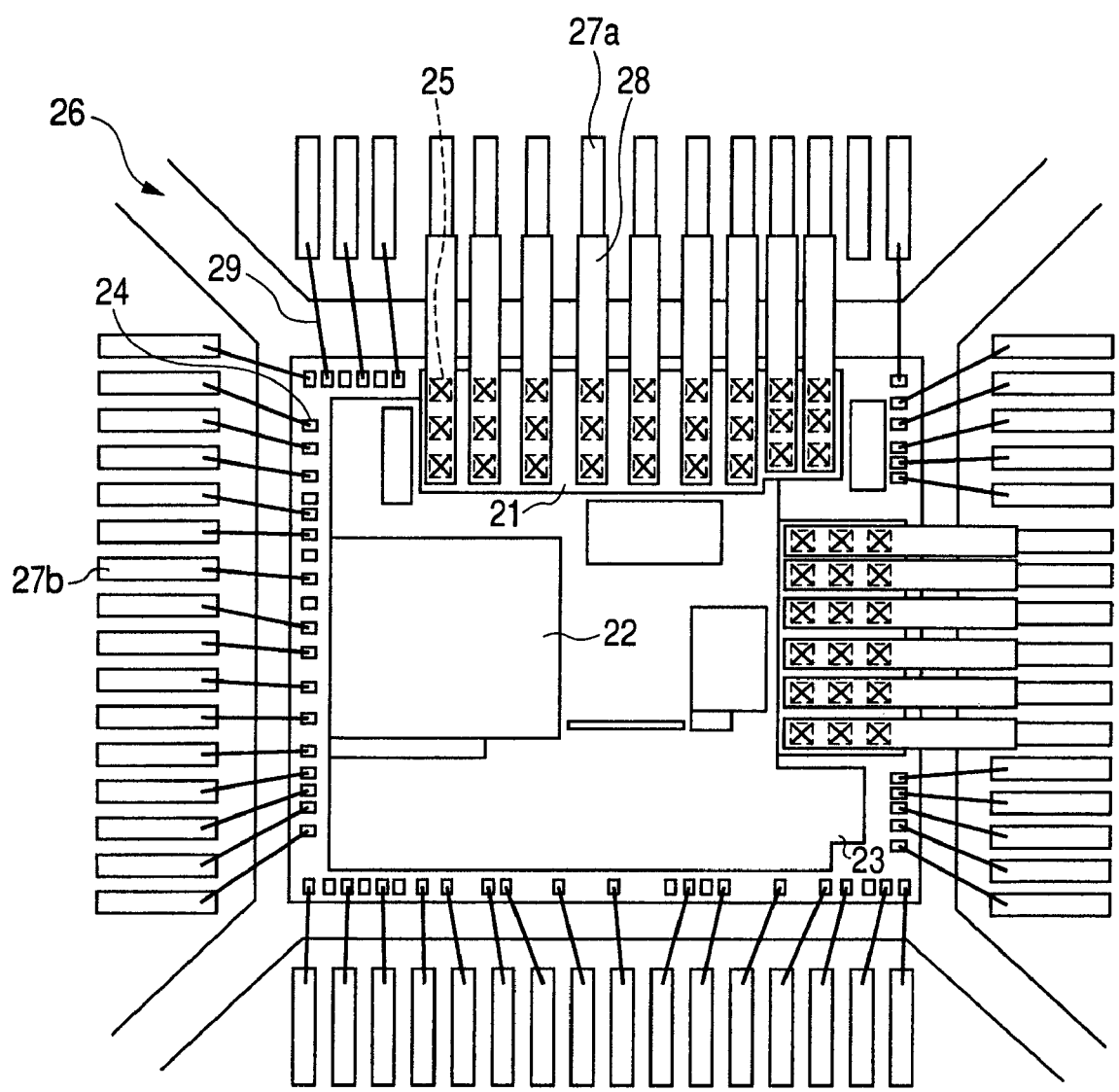
FIG. 17 is a plan view continued from FIG. 16 diagramatically showing the manufacturing process of the semiconductor device.

As shown in FIG. 15, the semiconductor chip 20 is mounted on the lead frame 26 where multiple leads 27a and 27b are formed (Step S201 in FIG. 14). As shown in FIG. 16, the wire 29 is used to connect the bonding pad 24 and the lead 27b formed along the outside periphery of the semiconductor chip 20 (Step S202 in FIG. 14). A connection material is applied to the pad 25 formed in the power transistor formation region and to the lead 27a connected to the pad 25 (Step S203 in FIG. 14). As shown in FIG. 17, the clip 28 is mounted on the pad 25 applied with the connection material and on the lead 27a applied with the connection material (Step S204 in FIG. 14). In this manner, the clip 28 electrically connects the pad 25 with the lead 27a. A reflow process is then applied to the semiconductor chip 20 mounted on the lead frame 26 to connect the connection material, the pad 25, and the lead 27a (Step S205 in FIG. 14). The semiconductor chip 20 is sealed with the resin (Step S206 in FIG. 14), and then a terminal is formed (Step S207 in FIG. 14). This method can also manufacture the semiconductor device according to the embodiment.

While there has been described the specific preferred embodiment of the present invention made by the inventors, it is to be distinctly understood that the present invention is not limited thereto but may be otherwise variously embodied within the spirit and scope of the invention.

The embodiment has been described using the hard disk apparatus as an example but is not limited thereto. For example, the embodiment can be applied to ASIC products used for vehicular engine control and ABS systems.

The invention can be widely used for manufacturing industries that manufacture semiconductor devices.

The invention claimed is:

1. A method of manufacturing a semiconductor device comprising:
   (a) preparing a lead frame having a plurality of leads;
   (b) mounting a semiconductor chip over the lead frame, the semiconductor chip has a plurality of bonding pads arranged over an obverse surface of the semiconductor chip;
   (c) electrically connecting the plurality of bonding pads and the plurality of leads respectively;
   (d) sealing the semiconductor chip and parts of the plurality of leads by using a sealing body; and
   (e) forming the plurality of leads exposed from the sealing body to a plurality of terminals;
   wherein a power transistor and a control integrated circuit controlling the power transistor are formed in the semiconductor chip,
   wherein the plurality of bonding pads include a first bonding pad and a second bonding pad, the first bonding pad connects with the power transistor, and the second bonding pad connects with the control integrated circuit,
   wherein the plurality of leads include a first lead and a second lead,
   wherein the step (c) comprising:
   (c1) electrically connecting the first bonding pad and the first lead by using a first conductive material; and
   (c2) electrically connecting the second bonding pad and the second lead by using a second conductive material, a cross-section area of the second conductive material is smaller than a cross-section area of the first conductive material; and
   wherein the control integrated circuit is disposed such that the control integrated circuit does not overlap the first bonding pad and the second bonding pad in plan view, and the power transistor is disposed under the first bonding pad such that the power transistor overlaps with the first bonding pad in plan view.

2. A method of manufacturing the semiconductor device according to claim 1, wherein the first conductor material is a metal clip and the second conductor material is a metal wire.

3. A method of manufacturing the semiconductor device according to claim 2, wherein in the step (c), a connection of the metal clip and the first bonding pad is heat-treated a solder or a conductive resin paste between the clip and the first bonding pad.

4. A method of manufacturing the semiconductor device according to claim 3, wherein the step (c1) is done earlier than the step (c2).

* * * * *